United States Patent
Lu

(10) Patent No.: US 9,588,189 B2
(45) Date of Patent: Mar. 7, 2017

(54) SYSTEM AND METHOD OF DETECTING ULTRA WEAK MAGNETIC FIELD

(71) Applicant: PROLIFIC TECHNOLOGY INC., Taipei (TW)

(72) Inventor: Chih-Shiun Lu, Taipei (TW)

(73) Assignee: PROLIFIC TECHNOLOGY INC., Taipei (TW)

(*) Notice: Subject to any disclaimer, the term of this patent is extended or adjusted under 35 U.S.C. 154(b) by 186 days.

(21) Appl. No.: 14/166,929

(22) Filed: Jan. 29, 2014

(65) Prior Publication Data

US 2015/0212164 A1   Jul. 30, 2015

(51) Int. Cl.
| | |
|---|---|
| *G01R 33/00* | (2006.01) |
| *G01R 33/04* | (2006.01) |
| *G01R 33/06* | (2006.01) |
| *G01R 33/18* | (2006.01) |

(52) U.S. Cl.
CPC ......... *G01R 33/0017* (2013.01); *G01R 33/04* (2013.01); *G01R 33/063* (2013.01); *G01R 33/18* (2013.01)

(58) Field of Classification Search
CPC ............ G01R 33/00; G01B 7/14; H01L 43/06
See application file for complete search history.

(56) References Cited

U.S. PATENT DOCUMENTS

| | | | | |
|---|---|---|---|---|
| 4,525,688 A | * | 6/1985 | Murphy et al. ............. | 333/81 R |
| 5,103,188 A | * | 4/1992 | Bender .................... | H03F 3/211 330/257 |
| 6,897,649 B2 | * | 5/2005 | Kawase .................... | 324/249 |
| 8,031,002 B2 | * | 10/2011 | Jo ........................... | H03F 1/301 330/264 |
| 8,731,657 B1 | * | 5/2014 | Shambayati ....... | A61N 1/36014 128/908 |
| 2003/0164765 A1 | * | 9/2003 | Sumi et al. .................. | 340/551 |
| 2004/0095126 A1 | * | 5/2004 | Kudo .................... | G01R 15/18 324/117 R |
| 2004/0156094 A1 | * | 8/2004 | Kawahara ......... | H01S 3/094003 359/333 |
| 2008/0048781 A1 | * | 2/2008 | Wagner et al. .............. | 330/278 |
| 2010/0158055 A1 | * | 6/2010 | Giebel .............. | G06K 7/10584 372/29.011 |

(Continued)

*Primary Examiner* — Huy Q Phan
*Assistant Examiner* — Alvaro Fortich
(74) *Attorney, Agent, or Firm* — Lin & Associates Intellectual Property, Inc.

(57) ABSTRACT

A system of detecting magnetic field comprises a magnetic impedance element surrounded by a detection coil, a stimulus unit that generates pulse signal of programmable rise/fall time to drive the magnetic impedance element, and a signal detection module that detects signal on the detection coil, wherein the signal detection module includes a buffer unit having adjustable bandwidth for shaping output signal of the detection coil, a signal amplify unit that includes a sample and hold circuit and a chopping programmable gain amplifier to amplify buffered signal from the buffer unit, a signal processing unit that processes amplified signal from the signal amplify unit by applying a selectable algorithm to output detection result, and a control unit that connects the signal processing unit to generate control parameters of the stimulus unit, the buffer unit, the signal amplify unit, and the signal processing unit.

9 Claims, 12 Drawing Sheets

(56) References Cited

U.S. PATENT DOCUMENTS

2011/0262149 A1* 10/2011 Terada ................... H04B 10/60
                                                               398/202
2012/0326788 A1* 12/2012 Cui et al. ...................... 330/277
2013/0265036 A1* 10/2013 Friedrich et al. .......... 324/207.2

* cited by examiner

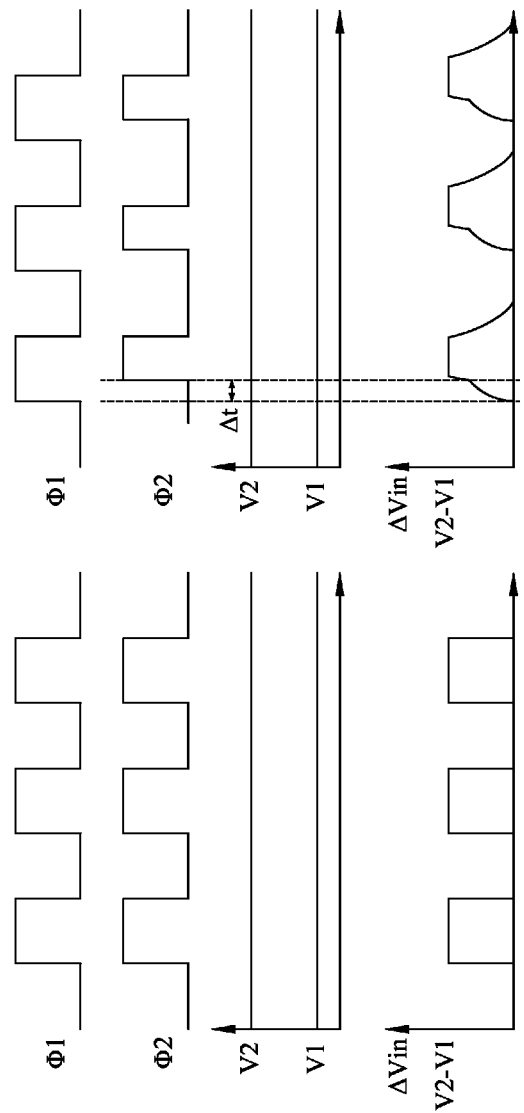

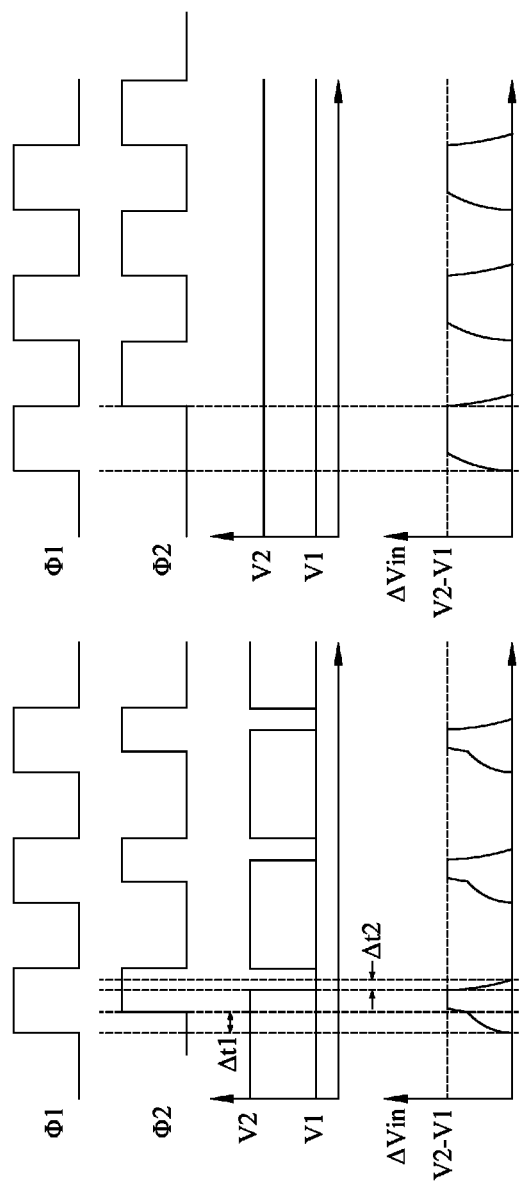

SYSTEM AND METHOD OF DETECTING ULTRA WEAK MAGNETIC FIELD

BACKGROUND

Recently, technique adapted to detect the terrestrial magnetism has come to be required to highly sensitively and accurately detect a very weak magnetic field so as to broaden the scope of application. Magnetic impedance (MI) elements have been attracting attention as magnetic field detecting elements of this type. With a known magnetic field detecting method using MI element, the magnetic field is detected by directly applying a high frequency electric current to a magnetic element and detecting the voltage signal generated by the detection coil wound around or arranged in the vicinity of the magnetic element.

FIG. 1 illustrates a basic circuit diagram of a circuit that can be used for detecting magnetic field. Referring to FIG. 1, a pulse oscillation is generated by means of an oscillation circuit 11 surrounded by broken lines and an electric current is made to flow to MI element 14 by way of inverter 12 and current regulating resistor 13. Then, the change in the magnetic flux caused by the MI element 14 is taken out as a change in the voltage generated in detection coil 15 by winding the detection coil 15 around the MI device 14. One of the opposite ends of the detection coil 15 is grounded while the other end is connected to waveform detection circuit 16 formed by a peak detection diode and a RC circuit so that an amplitude-modulated magnetic field signal is taken out from the waveform detection circuit 16. Alternatively, the magnetic field signal may be detected by synchronous detection substantially in synchronism with rises and falls of oscillation of the oscillation circuit 11 by means of an analog switch with a hold capacitor. Then a voltage Vso for a zero external magnetic field is characterized and a reference voltage that matches the voltage Vso is selected by means of an amplifier 17 having a variable resistor 18 inserted between the power supply voltage and the grounding terminal. Thus the output voltage is regulated manually at the output of the amplifier.

However, the characterized Vso usually changes as the ambient environment changes. Under such circumstances, it is difficult to manually regulate the output voltage. The sampling jitter for peak detection causes much higher signal variation if the signal on the detection coil is sharp at the peak top. It is also unable to optimize signal detection if magnetic field is not smooth or magnetic field changes dramatically, even coupled with nonlinear effect. Therefore the magnetic detection circuit for detecting magnetic field is unable to detect very weak magnetic field especially for sub mG (milliGauss) magnetic field or detect noisy magnetic field. As a result this detection technique will cause large error in modern application especially for application such as air mouse, gyro, etc.

The existing technologies of detecting magnetic field have drawbacks of being unable to handle conditions such as element intrinsic noise of an oscillation circuit, sampling jitter induced noise of peak voltage variation, coil loading effect that affects non-external magnetic field characterization, weak magnetic field, etc. Thus, it is imperative to devise a technology of detecting magnetic field having high flexibility and reliability.

SUMMARY

The exemplary embodiments of the disclosure may provide a magnetic field detection technique for detecting the intensity of the external magnetic field by using a magnetic impedance element whose impedance changes according to an external magnetic field. More particularly, the present invention relates to a magnetic field detection technique for highly sensitively and accurately detecting a very weak magnetic field generated by the terrestrial magnetism or a very weak electric current.

One exemplary embodiment relates to a system of detecting magnetic field. The system comprising: a magnetic impedance element surrounded by a detection coil, a stimulus unit generating pulse signal of programmable rise/fall time to drive the magneto-impedance element, and a signal detection module detecting signal on the detection coil, wherein the signal detection module includes a buffer unit having adjustable bandwidth for shaping output signal of the detection coil, a signal amplify unit amplifying buffered signal from the buffer unit, a signal processing unit processing amplified signal from the signal amplify unit by applying selectable algorithm to output detection result, and a control unit connecting the signal processing unit to generate control parameters of the stimulus unit, the buffer unit, the amplify unit, and the signal processing unit.

Another exemplary embodiment relates to a method of detecting magnetic field. The method comprising: generating voltage of programmable rise/fall time to drive a magnetic impedance element surrounded with a coil; shaping signal outputted from the detection coil by using a buffer having adjustable bandwidth; amplifying buffered signal outputted from the buffer by using a sample and hold circuit and a chopping programmable gain amplifier; processing amplified signal outputted from the chopping programmable gain amplifier with selectable algorithm to output detection result; and checking the detection result to control the generating voltage, the buffer, the sample and hold circuit, the chopping programmable gain amplifier, and the selecting algorithm.

BRIEF DESCRIPTION OF THE DRAWINGS

FIG. 4a-4d illustrates the generated signals of programmable rise/fall time in the stimulus unit of FIG. 3, according to an exemplary embodiment.

DETAILED DESCRIPTION OF DISCLOSED EMBODIMENTS

Figure 1:
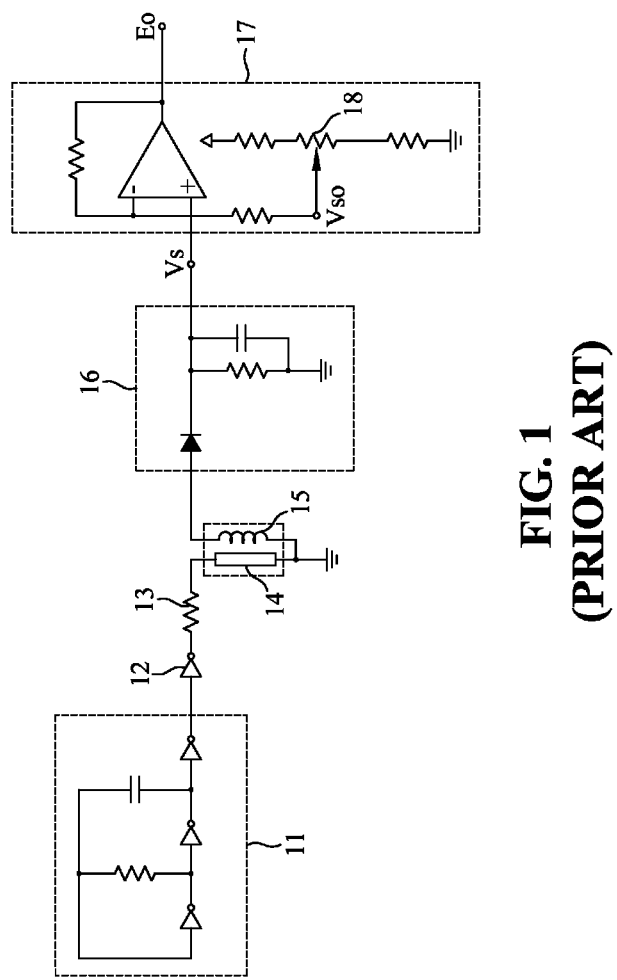
FIG. 1 illustrates a prior art basic circuit diagram of a circuit that can be used for detecting the magnetic field.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

The exemplary embodiments in the disclosure provide a magnetic field detection technique for detecting the intensity of the external magnetic field by using a magnetic impedance element whose impedance changes according to an external magnetic field. More particularly, the present invention relates to a magnetic field detection technique for highly sensitively and accurately detecting a very weak magnetic field generated by the terrestrial magnetism or a very weak electric current.

Figure 2:
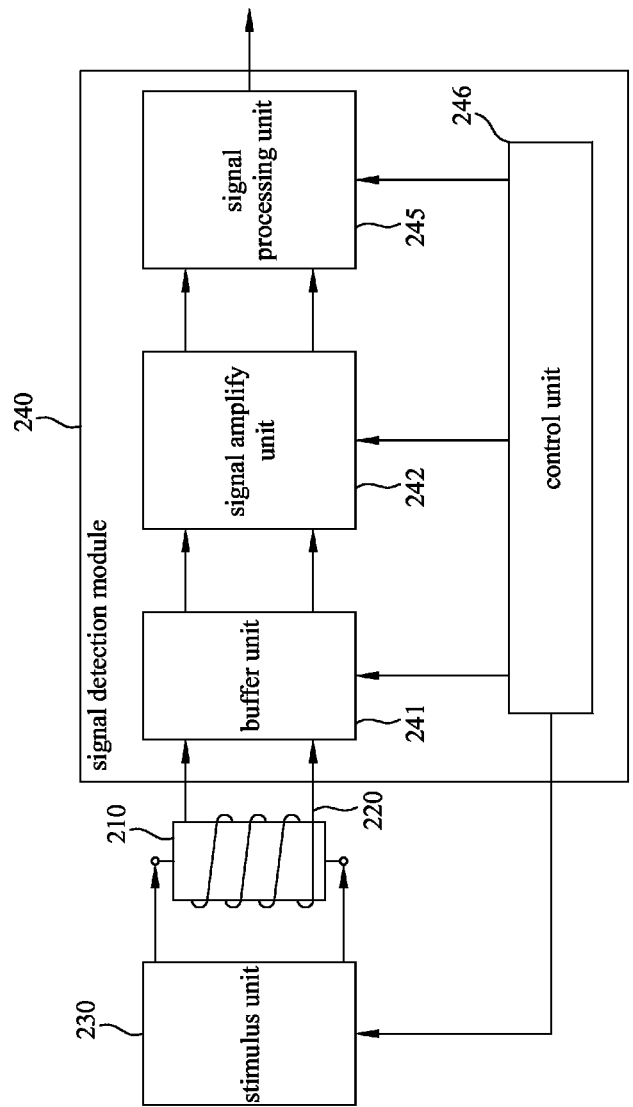
FIG. 2 illustrates a system of detecting magnetic field, according to an exemplary embodiment.

One exemplary embodiment relates to a system of detecting magnetic field. FIG. 2 illustrates a system of detecting magnetic field, according to an exemplary embodiment. Referring to FIG. 2, the system comprises a magnetic impedance element 210 surrounded by a detection coil 220, a stimulus unit 230 that generates signal of programmable rise/fall time to drive the magneto-impedance element 210, and a signal detection module 240 that detects output signal of the detection coil 220, wherein the signal detection module includes a buffer unit 241 having adjustable bandwidth for shaping output signal of the detection coil 220, a signal amplify unit 242 that amplifies buffered signal from the buffer unit 241, a signal processing unit 245 that processes amplified signal from the signal amplify unit 242 by applying selectable algorithm to output detection result, and a control unit 246 that connects the signal processing unit 245 to generate control parameters of the stimulus unit 230, the buffer unit 241, the signal amplify unit 242, and the processing unit 245.

Figure 3:
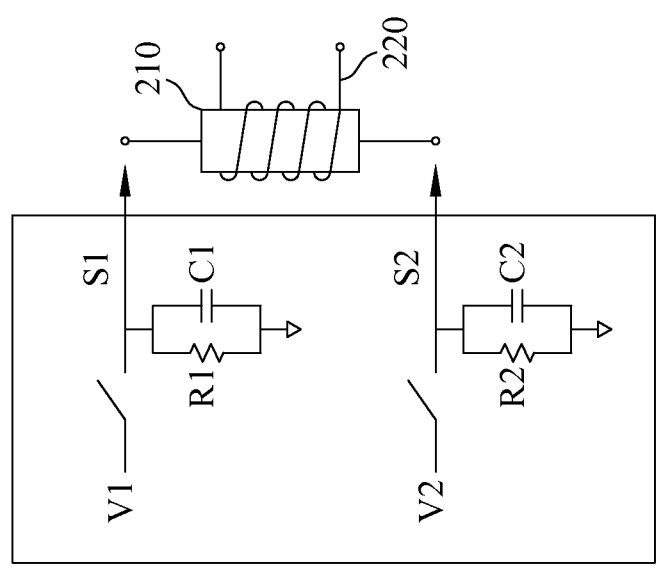
FIG. 3 illustrates the stimulus unit in the system of detecting magnetic field of FIG. 2 to drive the magnetic impedance element, according to an exemplary embodiment.

Refer to FIG. 2, the magnetic impedance element 210 changes impedance according to an external magnetic field. The stimulus unit 230 generates signals of programmable rise/fall time to drive the magnetic impedance element 210. The signals generated by the stimulus unit 230 may be implemented by the circuit diagram shown in FIG. 3. As shown in FIG. 3, two voltages V1 and V2 are applied on the circuits of two switches S1 and S2 coupled with two RC-in-parallel R1C1 and R2C2 circuits, to connect both terminals of the magnetic impedance element 210 to drive the magnetic impedance element 210.

As a result in FIG. 3, with different voltage levels of two voltages V1 and V2, switch timings Φ1 and Φ2 of switches S1 and S2, and components values of R1C1 and R2C2, the signal VI coupled on both terminals of the magnetic impedance element 210 is shown in FIG. 4a-4d. In FIG. 4a, two voltages V1 and V2 are two different DC voltages, and switch timing Φ1 and Φ2 of switches S1 and S2 are the same; in FIG. 4b, two voltages V1 and V2 are two different DC voltages, and switch timing Φ1 and Φ2 of switches S1 and S2 are two different clock timings; in FIG. 4c, two voltages V1 and V2 are of two different voltages, i.e., V1 is a DC voltage, V2 is a two levels voltage, and switch timing Φ1 and Φ2 of switches S1 and S2 are two different clock timings; and in FIG. 4d, two voltages V1 and V2 are of two different DC voltages, switch timings Φ1 and Φ2 of switches S1 and S2 are two opposite clock timings, and components values of R1C1 and R2C2 are different. The different voltage levels of two voltages V1 and V2, switch timings Φ1 and Φ2 of switches S1 and S2, and components values of R1C1 and R2C2 are programmable, and controlled by the control unit 246 through generating corresponding control parameters. Therefore the signal generated from the stimulus unit 230 is a signal of programmable rise/fall time.

When the signals generated from the stimulus unit 230 applied to both terminals of the magnetic impedance element 210, the magnetic impedance element 210 passes an electric current according to its impedance. The detection coil 220, which is around such as wound or wrapped around the magnetic impedance element 210, induces and outputs a voltage signal at both terminals of the detection coil wherein the voltage signal is proportional to the magnetic field based on electric current.

Figure 5:
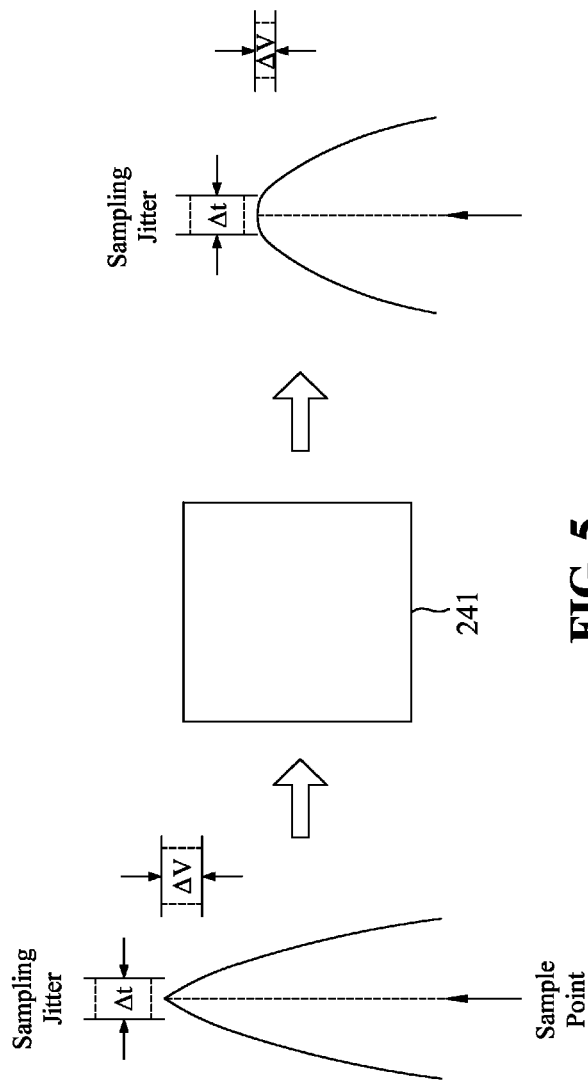
FIG. 5 illustrates input signal and output signal of the buffer unit in the system of detecting magnetic field of FIG. 2, according to an exemplary embodiment.

After the detection coil 220 outputs a voltage signal, the signal detection module 240 detects signal on the detection coil. The buffer unit 241 of the signal detection module 240 having adjustable bandwidth may shape the output signal of the detection coil, i.e., to reduce the signal variation near the sampling point for peak value. FIG. 5 illustrates the input signal and output signal of the buffer unit in the system of detecting magnetic field of FIG. 2, according to an exemplary embodiment. The buffer unit provides a selected bandwidth frequency response to the signal on the detection coil to reduce the signal variation due to sampling jitter of peak value. As shown in FIG. 5, the output signal variation ΔV of the buffer unit is reduced with same sampling jitter Δt. According to an exemplary embodiment, the adjustable bandwidth is adjustable and controlled by the control unit 246 through generating corresponding control parameters.

Figure 6:
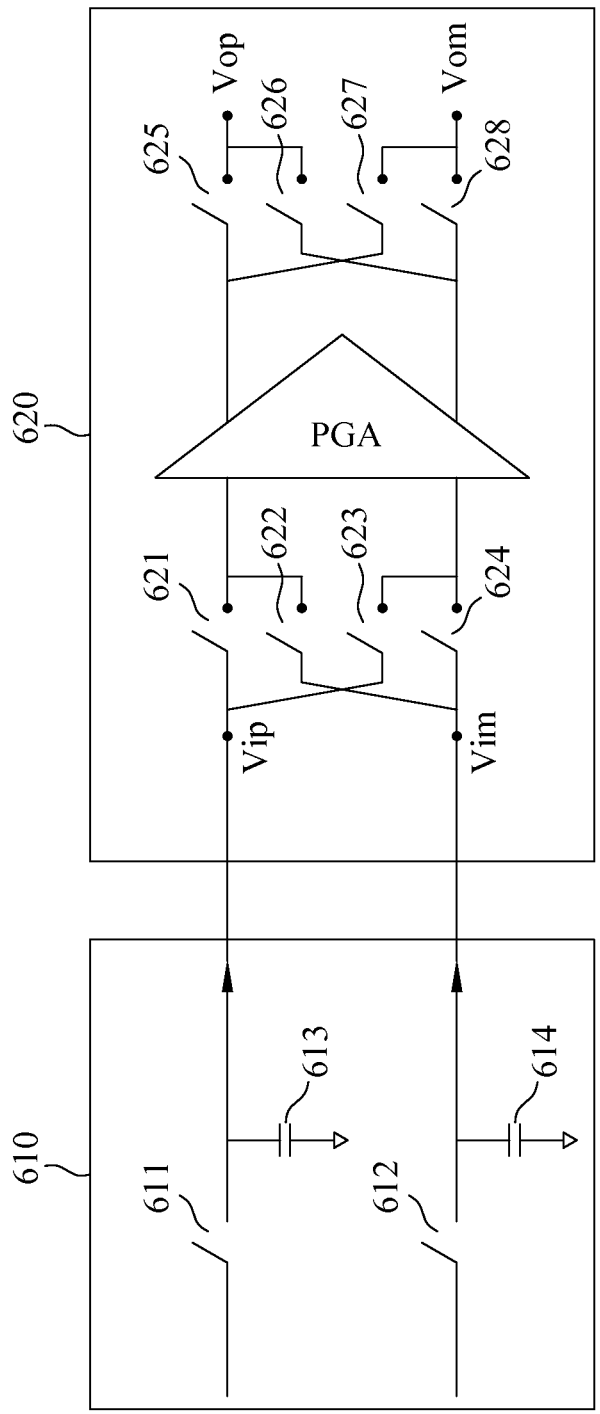
FIG. 6 illustrates the signal amplify unit in the system of detecting magnetic field of FIG. 2, according to an exemplary embodiment.

According to an exemplary embodiment, the signal amplify unit 242 connects to the buffer unit 241 to provide amplification function for further processing. FIG. 6 illustrates the amplify unit in the system of detecting magnetic field of FIG. 2, according to an exemplary embodiment. As shown in Fig, 6, the signal amplify unit 242 includes a sample and hold circuits 610 and a chopping programmable gain amplifier (PGA) 620 to amplify buffered signal from the buffer unit. The sample and hold circuits 610 includes sampling switches 611 and 612, and hold capacitors 613 and 614 to hold peak values of the buffered voltages outputted from both terminals of the buffer unit. The chopping programmable gain amplifier (PGA) 620 includes switches 621, 622, 623, and 624 for chopping input hold signals Vip and Vim from both terminals of the sample and hold circuits 610, a programmable gain amplifier (PGA) for amplifying, and switches 625, 626, 627, and 628 for sending output signals Vop and Vom to the following signal processing unit 245. The advantage of the amplify unit 242 is reducing both flick noise and noise due to signal unbalance mismatch. The switch timings of switches 611 and 612, switches 621-628, and programmable gain amplifier (PGA) are programmable and controlled by the control unit 246 through generating corresponding control parameters. Therefore the signal amplified by the signal amplify unit 242 is programmable amplified signal.

Figure 7:
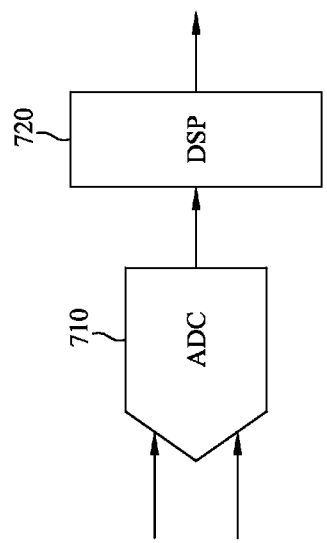
FIG. 7 illustrates the processing unit in the system of detecting magnetic field of FIG. 2, according to an exemplary embodiment.
Figure 8:
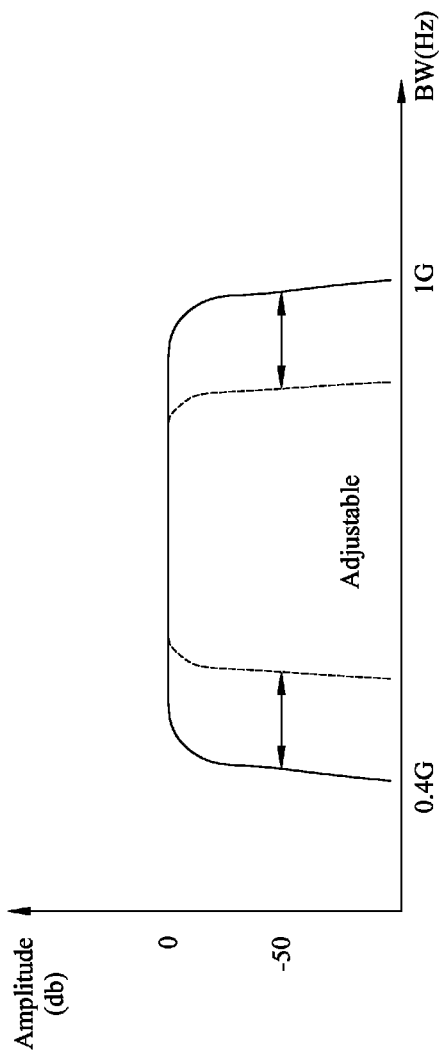
FIG. 8 illustrates the adjustable bandwidth for signal processing of digital signal processor, according to an exemplary embodiment.

In FIG. 2, the signal processing unit 245 connects to the amplify unit 242 to process amplified signal by applying a selectable algorithm to output detection result. FIG. 7 illustrates the processing unit in the system of detecting magnetic field of FIG. 2, according to an exemplary embodiment. Referring to FIG. 7, the processing unit includes an analog-to-digital converter (ADC) 710 and a digital signal processor 720. Wherein the ADC 710 converts the analog signal from the amplify unit into digital data, and the digital signal processor 720 processes different algorithms of signal processing, such as digital signal filtering to reduce out-of-band noise for different applications. As shown in FIG. 8, the adjustable bandwidth for signal processing is implemented by the digital signal processor in FIG. 7, according to an exemplary embodiment. The adjustable bandwidth for signal processing is adjustable and controlled by the control unit 246 that generates corresponding control parameters.

According to an exemplary embodiment, the control unit 246 connects the processing unit 245 to generate control parameters of the stimulus unit, the buffer unit, the signal amplify unit, and the processing unit. The control unit connects the processing unit to generate control parameters such as switch timing and voltage levels in the stimulus unit, bandwidth parameter in the buffer unit, switch timing in the signal amplify unit, and the filtering parameters in the processing unit. The control unit may include timing delay circuit to adjust switch timing. Also the control unit 246 may further include a memory to store updated control parameters.

Figure 9A:
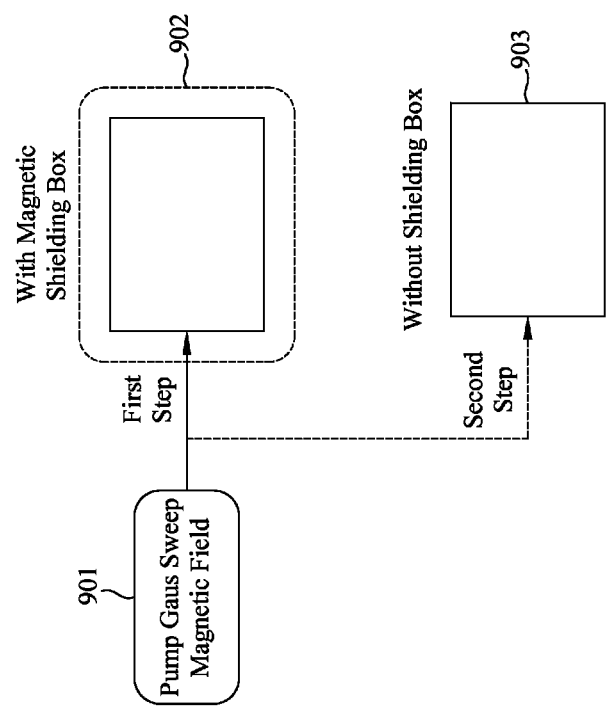
FIG. 9a-9b illustrates a flow chart for optimizing control parameters of the control unit in the system of detecting magnetic field, according to an exemplary embodiment.
Figure 9B:
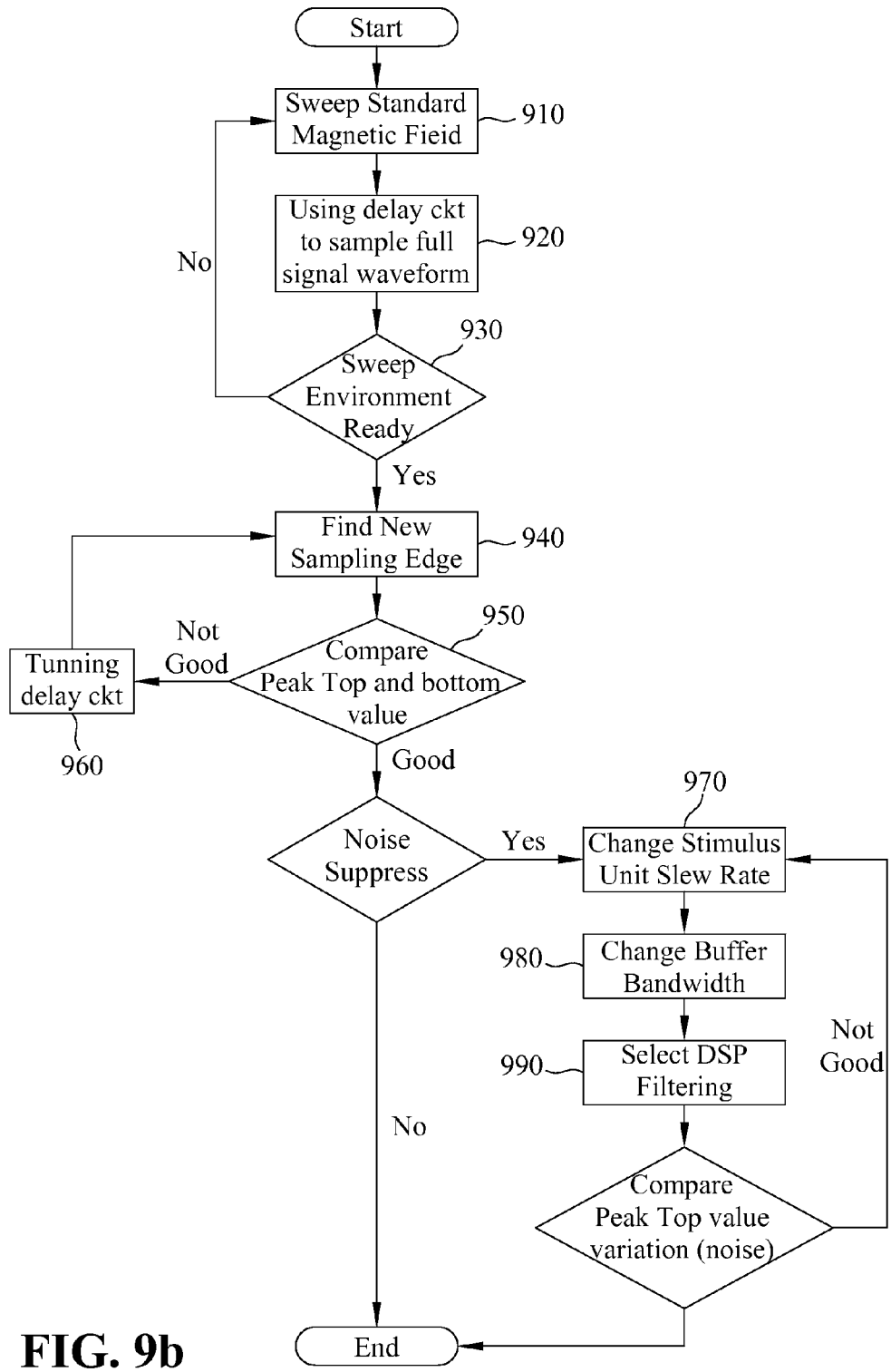

According to an exemplary embodiment, system setup and flow chart for optimizing control parameters of the control unit in the system of detecting magnetic field is shown in FIG. 9a -9b. Referring to FIG. 9a, the system setup uses pumping Gauss sweep magnetic field 901 to the system with two steps, wherein the first step is covering magnetic shielding box to the system 902, and the second step is without covering magnetic shielding box to the system 903. The flow chart for optimizing control parameters of the control unit is shown in FIG. 9b. As shown in FIG. 9b, firstly the system sweeps standard magnetic field (step 910), uses delay circuit in the control unit to generate timing to sample full signal waveform (step 920), and confirms sweep environment ready (step 930). Then the system finds new sampling edge (step 940) if needed through comparing peak top and bottom value (step 950) and tuning delay circuit in the control unit (step 960). Finally the system optimizes the system performance through changing stimulus slew rate (rise/fall time) in the stimulus unit (step 970), changing buffer bandwidth in the buffer unit (step 980), and selecting DSP filtering in the processing unit (step 990) to get better detection result.

Figure 10:
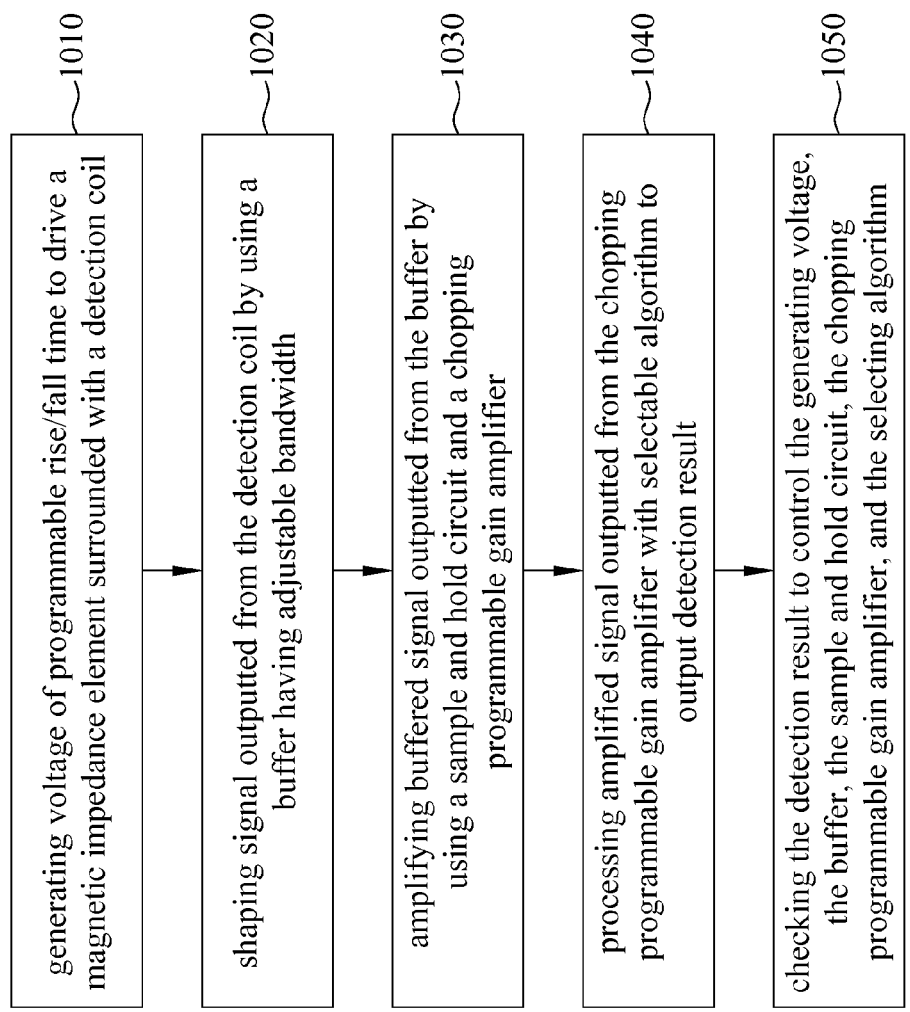
FIG. 10 illustrates a method of detecting magnetic field, according to an exemplary embodiment.

Another exemplary embodiment relates to a method of detecting magnetic field. FIG. 10 illustrates a method of detecting magnetic field, according to an exemplary embodiment. The method comprising: generating voltage of programmable rise/fall time to drive a magnetic impedance element surrounded with a detection coil (step 1010); shaping signal outputted from the detection coil by using a buffer having adjustable bandwidth (step 1020), amplifying buffered signal outputted from the buffer by using a sample and hold circuit and a chopping programmable gain amplifier (step 1030); processing amplified signal outputted from the chopping programmable gain amplifier with selectable algorithm to output detection result (step 1040); and checking the detection result to control the generating voltage, the buffer, the sample and hold circuit, and the chopping programmable gain amplifier (step 1050).

According to an exemplary embodiment, the control in the step 1050 may include using a memory to store updated control status. The selectable algorithm of processing amplified signal may be such as signal filtering.

In summary, the exemplary embodiments provide a magnetic field detection technique of using a signal generator with adjustable slew rate, a buffer for shaping signal to reduce sampling jitter effect, a sample and hold circuit and a chopping PGA for differential signal amplification to reduce signal unbalance effect, and digital signal processing for filtering to reduce out of band noise for different applications. As a result the technique of magnetic field detection with flexibility and reliability is provided for highly sensitively and accurately detecting a very weak magnetic field generated by the terrestrial magnetism or a very weak electric current.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A system of detecting magnetic field comprising:
a magnetic impedance element surrounded by a detection coil;
a stimulus unit generating signal of programmable rise/fall time to drive said magnetic impedance element; and
a signal detection module detecting signal on said detection coil,
wherein said signal detection module includes a buffer unit having adjustable bandwidth and shaping output signal of said detection coil; a signal amplify unit amplifying buffered signal from said buffer unit; a signal processing unit processing amplified signal from said signal amplify unit by applying a selectable algorithm to output detection result; and a control unit connecting said signal processing unit to generate control parameters of said stimulus unit, said buffer unit, said amplify unit, and said signal processing unit, said selectable algorithm being accomplished by digital signal filtering and said control parameters being optimized by sweeping a standard magnetic field, employing a delay circuit in said control unit to generate timing to sample a full signal waveform, confirming environment readiness of said sweeping, finding a new sampling edge if needed through comparing peak top and bottom values of the sampled signal waveform so as to tune said delay circuit, and optimizing system performance through changing said programmable rise/fall time in said stimulus unit, changing said adjustable bandwidth in said buffer unit, and selecting a digital signal filter for said digital signal filtering.

2. The system as claimed in claim 1, wherein said stimulus unit includes circuits of two switches coupled with two RC-in-parallel circuits, with two voltages being applied to the circuits respectively through the two switches.

3. The system as claimed in claim 1, wherein said buffer unit provides a selected bandwidth frequency response to signal on said detection coil to reduce the signal variation due to sampling jitter of peak value.

4. The system as claimed in claim 1, wherein said signal amplify unit includes a sample and hold circuit and a chopping programmable gain amplifier having a programmable gain amplifier and two input chopping switches and two output chopping switches respectively coupled to the input and output of the programmable gain amplifier.

5. The system as claimed in claim 1, wherein said processing unit includes an analog-to-digital converter and a digital signal processor.

6. The system as claimed in claim 1, wherein said control unit includes a memory to store updated control parameters.

7. The system as claimed in claim 1, wherein said control parameters are switch timings, voltage levels, bandwidth parameters, and filtering parameters.

8. A method of detecting magnetic field comprising:
- Generating signal of programmable rise/fall time in a stimulus unit to drive a magnetic impedance element surrounded with a coil;
- shaping signal outputted from said detection coil by using a buffer unit having adjustable bandwidth;
- amplifying buffered signal outputted from said buffer unit by using a sample and hold circuit and a chopping programmable gain amplifier;
- processing amplified signal outputted from said chopping programmable gain amplifier with a selectable algorithm to output detection result; and
- checking said detection result to control said signal of programmable rise/fall time, said buffer unit, said sample and hold circuit, said chopping programmable gain amplifier, and said selectable algorithm using a control unit to generate control parameters of said stimulus unit;
- where said selectable algorithm is accomplished by digital signal filtering and said control parameters are optimized by sweeping a standard magnetic field, employing a delay circuit in said control unit to generate timing to sample a full signal waveform, confirming environment readiness of said sweeping, finding a new sampling edge if needed through comparing peak top and bottom values of the sampled signal waveform so as to tune said delay circuit, and optimizing system performance through changing said programmable rise/fall time in said stimulus unit, changing said adjustable bandwidth in said buffer unit, and selecting a digital signal filter for said digital signal filtering.

9. The method as claimed in claim 8, wherein said control unit includes a memory to store updated control parameters.

* * * * *